United States Patent [19]

Kawakami et al.

[11] Patent Number: 5,266,748
[45] Date of Patent: Nov. 30, 1993

[54] PRINTED WIRING BOARD HAVING THROUGH-HOLES COVERED WITH INK LAYER AND METHOD OF MANUFACTURE THEREOF

[75] Inventors: Shin Kawakami; Hirotaka Okonogi; Katsutomo Nikaido; Junichi Ichikawa; Yoshio Nishiyama, all of Saitama, Japan

[73] Assignee: Nippon CMK Corp., Japan

[21] Appl. No.: 670,320

[22] Filed: Mar. 15, 1991

[30] Foreign Application Priority Data

May 18, 1990 [JP] Japan .................................. 2-128336

[51] Int. Cl.[5] .................................. H05K 1/00
[52] U.S. Cl. .................................. 174/262; 174/260; 174/264; 361/767; 361/818
[58] Field of Search .................. 361/400, 403, 406; 174/250, 262, 264, 260, 263; 29/846

[56] References Cited

U.S. PATENT DOCUMENTS

| | | | |
|---|---|---|---|
| 3,991,347 | 11/1976 | Hollyday | 174/260 |
| 4,389,771 | 7/1983 | Cassidy | 29/846 |
| 4,801,489 | 1/1989 | Nakagawa | 174/262 X |
| 4,806,706 | 2/1989 | Machida | 174/250 |
| 4,933,305 | 6/1990 | Kikkawa | 361/400 X |
| 4,967,313 | 10/1990 | Berner | 361/400 |

Primary Examiner—Leo P. Picard
Assistant Examiner—Cheryl R. Figlin
Attorney, Agent, or Firm—Bruce L. Adams; Van C. Wilks

[57] ABSTRACT

A printed wiring board includes a substrate having an electrically conductive pattern disposed on at least one side of the substrate. An electrically conductive through-hole is formed in the substrate. At least one of a solder resist film and an electromagnetic shielding layer undercoat film are disposed over the conductive pattern but do not cover the electrically conductive through-hole. An ink layer is formed over at least one end of the electrically conductive through-hole. A method of manufacturing the printed wiring board embodied by the invention comprises providing a substrate having an electrically conductive through-hole. A conductive pattern is formed on at least one side of the substrate. At least one of a solder resist film and an electromagnetic shielding layer undercoat film are formed over the conductive pattern but not over the electrically conductive through-hole. An ink layer is formed over at least one end of the electrically conductive through-hole. The ink layer may be formed simultaneously with the printing of symbols of electronic parts to be mounted on the printed wiring board.

10 Claims, 2 Drawing Sheets

PRINTED WIRING BOARD HAVING THROUGH-HOLES COVERED WITH INK LAYER AND METHOD OF MANUFACTURE THEREOF

BACKGROUND OF THE INVENTION

The present invention relates to a printed wiring board and a method of manufacturing the same.

DESCRIPTION OF THE PRIOR ART

As shown in FIGS. 2 and 3, conventionally when manufacturing a printed wiring board, more than three layers of a predetermined conductive pattern 3, including inner layers, are initially formed on one-side surface or both surfaces of an insulative substrate of a copper-coated stratified board the predetermined conductive pattern 3 is formed before eventually coating resist film 4 on the conductive pattern 3 by a screen printing operation which excludes a electrically connected region.

It is desired to shield key contacts, jumper wires and the surface of the printed wiring board from unnecessary electromagnetic wave radiation. There is a growing demand for a substrate which is capable of fully shielding from electromagnetic wave radiation by coating the surface of the printed wiring board with carbon or conductive metallic paste ink.

The conventional process for shielding electromagnetic wave radiation as mentioned above coats undercoat resist film 5 at least once by a screen printing operation to ensure insulation between layers before printing with conductive metallic paste ink.

In this case, normally, through-hole 2 (other than the through hole available for the insertion of electronic parts) is coated with ink when printing the solder resist film 4 and the undercoat film 5 before eventually printing symbols of mountable electronic parts with ink containing white pigment or pigments of other colors.

In order to provide a printed wiring board with insulation, conventionally either the solder resist film 4 or the undercoat resist film 5 is provided. Before printing either of these resist films, the surface of the substrate is treated by means of an acidic aqueous solution or a surface active agent so that adhesion and insulation between each layer can be promoted.

Nevertheless, since the conventional art prints resist film by fully covering the through hole 2, residue 10 of the acidic aqueous solution or the surface active agent used for the pretreatment of the substrate surface or aqueous solution containing acid or surface active agent remains in the through hole 2. This in turn causes the through hole 2 to easily be oxidized or become subject to a faulty insulation effect.

On the other hand, if the residual matter were still present in the through hole 2, this hole may be destroyed while the soldering process is underway after completing installation of electronic parts. If this occurs, either the wiring structure will be disconnected or solder 11 will swell onto the surface of the printed wiring board mounting electronic parts 8 as shown in FIG. 3, and as a result, the effect of soldering those electronic parts will become faulty as depicted in FIG. 3, where an electrical lead 9 of the electronic part 8 has been separated from a solder connection 7 to the conductive pattern 3.

The invention has thus been achieved to fully eliminate those defects inherent in the conventional prior art. An object of the invention is to provide a novel printed wiring board which is totally free from the cause of generating swollen solder 11, which leads to the deposition of residue 10 in the through hole region or results in the faulty soldering of electronic parts 8. In addition, another object of the invention is to provide a novel method of manufacturing the printed wiring board mentioned above.

SUMMARY OF THE INVENTION

The invention provides a novel printed wiring board which is characterized by the structure in which a conductive pattern is formed on an insulative substrate, where the printed solder resist film or the undercoat resist film is coated on the conductive pattern except for the electrically connected region of the conductive pattern. In addition, the resist film is solely provided for the electrically connected through hole of the substrate which mounts conductive pattern layers on both surfaces of the substrate or at least three conductive pattern layers.

According to the method of manufacturing the printed wiring board embodied by the invention, the predetermined conductive pattern is initially formed on an insulative, substrate, and then, the solder resist film or the undercoat resist film is superposed and printed on the insulative substrate except for the electrically connected region of the conductive pattern. The electrically conductive through hole region of the substrate having conductive pattern layers on both surfaces or at least three conductive pattern layers is not covered with the resist film during the resist film printing process, but only the through-hole region on one surface of the substrate is selectively coated and printed with ink during the final process for printing the symbols of mountable electronic parts.

The invention provides a novel printed wiring board and the method of manufacturing it. According to the invention, the through hole provided for the substrate mounting conductive pattern layers on both surfaces or at least three conductive pattern layers are not initially covered, and then, the solder resist film or the undercoat resist film is formed. Then, using ink available for the printing of symbols of component parts to be executed in the final printing process, the through holes are covered with ink simultaneous with the printing of the symbols of component parts. In consequence, residue of acidic aqueous solution or surface active agent used for the surface treatment of the substrate before the printing of the resist film can completely be removed by a manufacturing process.

Furthermore, by virtue of the process for covering the through hole with the ink available for the printing of symbols of the component parts, swelling of solder and flux onto the surface of the printed wiring board mounting the component parts due to the soldering process can be effectively prevented.

DESCRIPTION OF THE EMBODIMENTS

Figure 1:
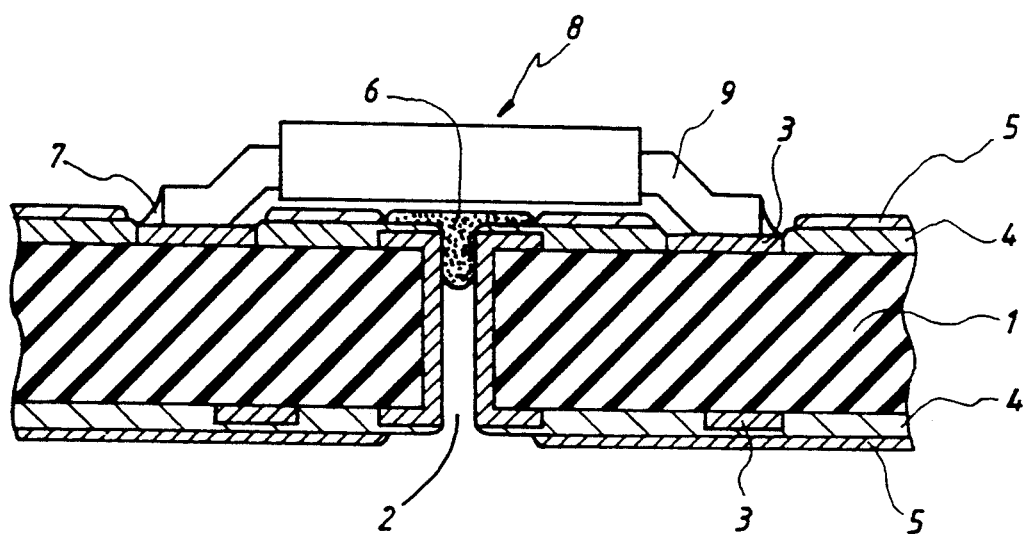
FIG. 1 is an enlarged sectional view of the printed wiring board embodied by the invention showing the condition after completion of the soldering process.

Referring now to the accompanying drawings, the printed wiring board according to an embodiment of the invention is described below. FIG. 1 designates an enlarged sectional view of the printed wiring board embodied by the invention after completion of the soldering process.

First, based on a conventional method, through hole 2 is formed in a substrate 1 and conductive pattern 3 is formed on one surface or both surfaces of the insulative substrate 1. Next, except for the electrically connected region, for example, where an electrical lead 9 of an electronic part 8 is to be soldered to the conductive pattern 3, either solder resist 4 or undercoat resist 5 (used as an electromagnetic wave shielding layer, as known in the art) is printed on the conductive pattern without covering the through hole 2. During the final process for printing the symbols of mountable component parts, the through hole 2 is covered and printed by means of ink 6 available for the printing of these symbols.

Figure 3:
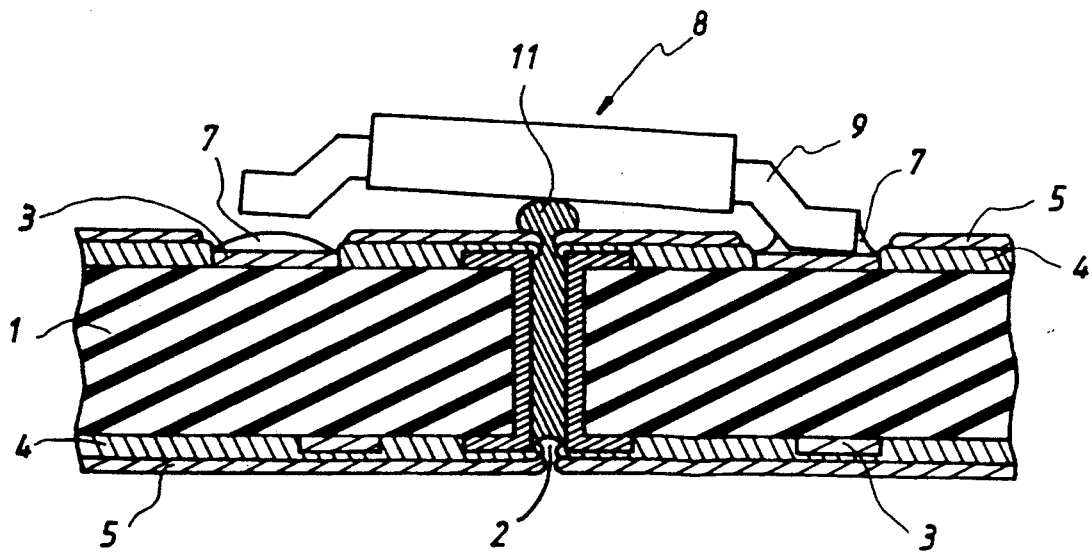

When applying a soldering process to the printed wiring board having the structure mentioned above, since the through hole 2 is not yet covered by means of the symbol printing ink, in contrast with such a through hole 2 containing incompletely shielded pin holes shown in FIG. 3, the printed wiring board embodied by the invention securely, prevents occurrence of faulty soldering of the component parts otherwise caused by swelling of solder 11 or flux onto the surface of the printed wiring board mounting those component parts.

Figure 2:
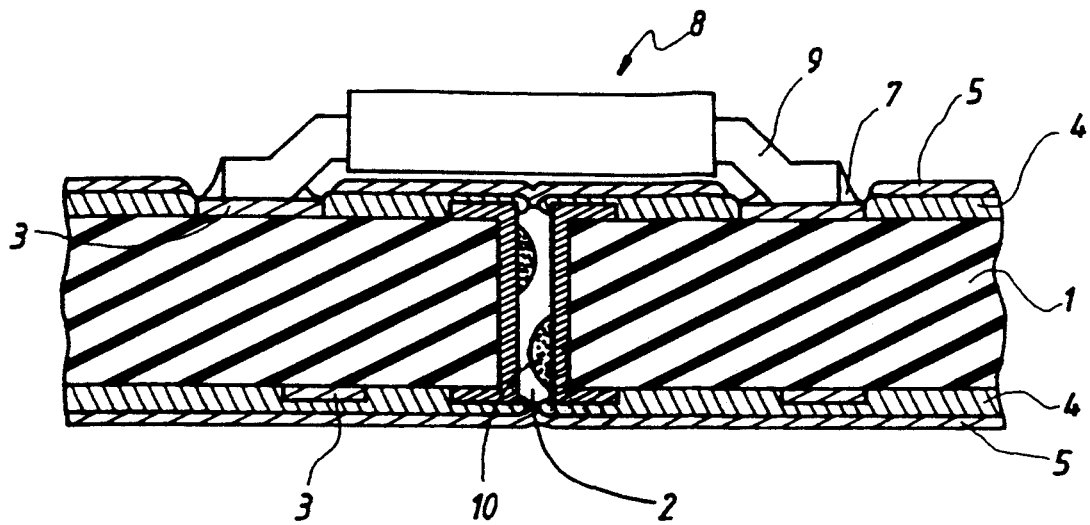
FIGS. 2 and 3 are respectively enlarged sectional views of a conventional printed wiring board after completion of the soldering process.

The printed wiring board shown in FIG. 1 according to an embodiment of the invention dispenses with the conventional process for covering the through hole region with solder resist or undercoat resist shown in FIG. 2, but instead, the printed wiring board embodied by the invention securely keeps the through hole 2 in the perfectly through condition until execution of the final process for printing symbols of component parts. As a result, even the least amount of residue 10 of acidic aqueous solution or surface active agent used for the surface treatment of the insulative substrate 1 prior to the resist printing will not be present in the through hole 2, thus securely preventing the through hole region 2 from oxidizing or being subject to faulty insulation.

According to the invention, the printed wiring board does not have any amount of residue to remaining in the through hole generated from the acidic aqueous solution or the surface active agent used for the surface treatment of the substrate performed during the manufacturing process. As a result, the through hole can be prevented from oxidizing and will not be subject to faulty insulation. In consequence, reliability of the printed wiring board is significantly improved.

Furthermore, since the through hole region is covered and printed by means of the symbol-printing ink simultaneous with the printing of these symbols of the component parts, swelling of solder and flux onto the surface of the printed wiring board mounting component parts is effectively prevented from occurring during the soldering process. In consequence, the method embodied by the invention also prevents the occurrence of defects of the soldering of component parts mounted on the surface of the printed wiring board.

What is claimed is:

1. A printed wiring board, comprising: a substrate having at least one electrically conductive pattern disposed on at least one side and having at least one electrically conductive through-hole; at least one of a solder resist film and an electromagnetic shielding layer undercoat film disposed over the at least one conductive pattern but not over the at least one electrically conductive through-hole; and an ink layer formed over at least one end of the at least one electrically conductive through-hole.

2. A printed wiring board according to claim 1; wherein the ink layer includes symbols of electronic parts to be mounted on the printed wiring board.

3. A printed wiring board according to claim 1; including electrically conductive patterns on both sides of the substrate; and wherein the at least one electrically conductive through-hole electrically connects the electrically conductive patterns.

4. A printed wiring board according to claim 3; further comprising at least one additional electrically conductive pattern disposed on the substrate; and wherein the at least one electrically conductive through-hole electrically connects each of the electrically conductive patterns with each other.

5. A printed wiring board according to claim 1; wherein the at least one conductive pattern has at least one connecting portion; and wherein the at least one of the solder resist film and the electromagnetic shielding layer undercoat film is disposed so as not to cover the at least one connecting portion.

6. A method of manufacturing a printed wiring board, comprising the steps of: providing a substrate having at least one electrically conductive through-hole; forming at least one electrically conductive pattern on at least one side of the substrate; forming at least one of a solder resist film and an electromagnetic shielding layer undercoat film over the at least one electrically conductive pattern but not over the at least one electrically conductive through-hole; and forming an ink layer over at least one end of the at least one electrically conductive through-hole.

7. A method of manufacturing printed wiring board according to claim 6; wherein the step of forming the ink layer includes simultaneously printing symbols of electronic parts to be mounted on the printed wiring board.

8. A method of manufacturing printed wiring board according to claim 6; wherein the step of forming at least one electrically conductive pattern includes forming electrically conductive patterns on both sides of the substrate such that the electrically conductive patterns are electrically interconnected by the at least one electrically conductive through-hole.

9. A method of manufacturing printed wiring board according to claim 8; further comprising the step of forming at least one additional conductive pattern on the substrate such that the at least one electrically conductive through-hole electrically connects each of the electrically conductive patterns with each other.

10. A method of manufacturing printed wiring board according to claim 6; wherein the at least one electrically conductive pattern has at least one connecting portion; and wherein the step of forming the at least one of the solder resist film and the electromagnetic shielding layer undercoat film includes forming the at least one of the solder resist film and the electromagnetic shielding layer undercoat film so as not to cover the at least one connecting portion.

* * * * *